US009110099B2

(12) United States Patent
Homan et al.

(10) Patent No.: US 9,110,099 B2
(45) Date of Patent: *Aug. 18, 2015

(54) SHIELDED ANTENNA FOR A DOWNHOLE LOGGING TOOL

(71) Applicant: Schlumberger Technology Corporation, Sugar Land, TX (US)

(72) Inventors: Dean M. Homan, Sugar Land, TX (US); Gerald N. Minerbo, Missouri City, TX (US); Robert C. Smith, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/537,644

(22) Filed: Nov. 10, 2014

(65) Prior Publication Data

US 2015/0061682 A1    Mar. 5, 2015

Related U.S. Application Data

(60) Division of application No. 13/750,766, filed on Jan. 25, 2013, now Pat. No. 8,884,624, which is a continuation of application No. 12/434,888, filed on May 4, 2009, now Pat. No. 8,368,403.

(51) Int. Cl.
*G01V 3/10* (2006.01)
*G01R 1/18* (2006.01)
(Continued)

(52) U.S. Cl.
CPC ............... *G01R 1/18* (2013.01); *E21B 47/102* (2013.01); *G01V 3/20* (2013.01); *G01V 3/28* (2013.01)

(58) Field of Classification Search
CPC .......... G01R 1/18; E21B 47/102; G01V 3/28; G01V 3/20
USPC .................................................. 324/323–375
See application file for complete search history.

(56) References Cited

U.S. PATENT DOCUMENTS 4,357,660 A    11/1982    Hepp
4,536,714 A     8/1985    Clark
(Continued)

OTHER PUBLICATIONS

International Preliminary Report on Patentability of PCT Application Serial No. PCT/US2011/034126 dated Nov. 8, 2012, 6 pages.
(Continued)

*Primary Examiner* — Melissa Koval
*Assistant Examiner* — Daniel Miller
(74) *Attorney, Agent, or Firm* — John Vereb

(57) ABSTRACT

A downhole logging tool includes a tool body having a co-located set of antennas located on the tool body and first and second antennas formed from respective first and second pairs of coil windings having a closed-loop pattern. Both the first and second pair of coil windings are arranged on diametrically opposed antenna sections. A cylindrical shield is disposed over the co-located set of antennas and has a first set of vertical slots arranged interposed between each of the underlying antenna sections, a second set of vertical slots arranged over each of the underlying antenna sections, with each of the second set of vertical slots being perpendicular to a portion of the coil winding in the underlying antenna section, and a set of non-vertical slots arranged over each the underlying antenna sections. Each of non-vertical slots is perpendicular to a portion of the coil winding in the underlying antenna section.

6 Claims, 5 Drawing Sheets

(51) Int. Cl.
 *E21B 47/10* (2012.01)
 *G01V 3/28* (2006.01)
 *G01V 3/20* (2006.01)

(56) References Cited

U.S. PATENT DOCUMENTS

| | | | |
|---|---|---|---|
| 4,675,611 | A | 6/1987 | Chapman et al. |
| 4,899,112 | A | 2/1990 | Clark et al. |
| 4,901,069 | A | 2/1990 | Veneruso |
| 6,008,646 | A | 12/1999 | Griffin et al. |
| 6,181,138 | B1 | 1/2001 | Hagiwara et al. |
| 6,304,086 | B1 | 10/2001 | Minerbo et al. |
| 6,373,248 | B1 | 4/2002 | Poitzsch et al. |
| 6,566,881 | B2 | 5/2003 | Omeragic et al. |
| 6,788,065 | B1 | 9/2004 | Homan et al. |
| 7,038,457 | B2 | 5/2006 | Chen et al. |
| 7,093,672 | B2 | 8/2006 | Seydoux et al. |
| 7,239,145 | B2 | 7/2007 | Homan et al. |
| 8,368,403 | B2 | 2/2013 | Homan et al. |
| 8,884,624 | B2 | 11/2014 | Homan et al. |
| 2003/0155923 | A1 | 8/2003 | Omeragic et al. |
| 2003/0184304 | A1 | 10/2003 | Homan et al. |
| 2004/0059515 | A1 | 3/2004 | Kennedy |
| 2004/0061622 | A1 | 4/2004 | Clark |
| 2004/0113609 | A1 | 6/2004 | Homan et al. |
| 2006/0145700 | A1 | 7/2006 | Tabanou et al. |
| 2006/0235618 | A1 | 10/2006 | Wu et al. |
| 2007/0137854 | A1 | 6/2007 | Homan et al. |
| 2007/0236221 | A1 | 10/2007 | Merchant et al. |
| 2007/0247330 | A1 | 10/2007 | Clark |
| 2008/0074336 | A1* | 3/2008 | Signorelli et al. ............ 343/719 |
| 2008/0136419 | A1 | 6/2008 | Seydoux et al. |
| 2008/0143336 | A1 | 6/2008 | Legendre et al. |
| 2008/0224707 | A1 | 9/2008 | Wisler et al. |
| 2011/0238312 | A1 | 9/2011 | Seydoux et al. |

OTHER PUBLICATIONS

First Office Action for Chinese Application No. 201010170063.3 dated Aug. 2, 2013.

\* cited by examiner

SHIELDED ANTENNA FOR A DOWNHOLE LOGGING TOOL

CROSS-REFERENCE TO RELATED APPLICATIONS

The present application is a divisional application of U.S. patent application Ser. No. 13/750,766, entitled, "Shielded Antenna for a Downhole Logging Tool," filed on Jan. 25, 2013, which is a continuation of U.S. patent application Ser. No. 12/434,888, entitled "Logging Tool Having Shielded Triaxial Antennas," filed on May 4, 2009, the complete disclosures of which are hereby incorporated by reference.

BACKGROUND

The present disclosure relates generally to logging tools and particularly to electromagnetic logging tools.

Logging tools have long been used in wellbores to make, for example, formation evaluation measurements to infer properties of the formations surrounding the borehole and the fluids in the formations. Common logging tools include electromagnetic tools, nuclear tools, and nuclear magnetic resonance (NMR) tools, though various other tool-types are also used. Electromagnetic logging tools typically measure the resistivity (or its reciprocal, conductivity) of a formation. Prior art electromagnetic resistivity tools include galvanic tools, induction tools, and propagation tools. Typically a measurement of the attenuation and phase shift of an electromagnetic signal that has passed through the formation is used to determine the resistivity. The resistivity may be that of the virgin formation, the resistivity of what is known as the invasion zone, or it may be the resistivity of the wellbore fluid. In anisotropic formations, the resistivity may be further resolved into components commonly referred to as the vertical resistivity and the horizontal resistivity.

Early logging tools, including electromagnetic logging tools, were run into a wellbore on a wireline cable, after the wellbore had been drilled. Modern versions of such wireline tools are still used extensively. However, the need for information while drilling the borehole gave rise to measurement-while-drilling (MWD) tools and logging-while-drilling (LWD) tools. MWD tools typically provide drilling parameter information such as weight on the bit, torque, temperature, pressure, direction, and inclination. LWD tools typically provide formation evaluation measurements such as resistivity, porosity, and NMR distributions (e.g., T1 and T2). MWD and LWD tools often have characteristics common to wireline tools (e.g., transmitting and receiving antennas), but MWD and LWD tools must be constructed to not only endure but to operate in the harsh environment of drilling.

SUMMARY

Certain aspects of embodiments disclosed herein by way of example are summarized below. It should be understood that these aspects are presented merely to provide the reader with a brief summary of certain forms the various techniques disclosed herein might take and that these aspects are not intended to limit the scope of any the subject matter claimed herein. Indeed, any technique disclosed and/or claimed herein may encompass a variety of aspects that may not be set forth in this summary section.

The present disclosure relates to a downhole logging tool having shielded antennas. The downhole logging tool may include a wireline or while-drilling tool, and it may be an induction or propagation tool.

In one embodiment, the downhole logging tool has a tool body with a longitudinal axis, a set of antennas located on the tool body and including coil windings forming a closed-loop pattern, and a shield disposed over the antennas and having an arrangement of slots with each slot being substantially perpendicular to a proximate portion of at least one of the underlying coil windings, wherein the path length around each slot is more than twice the length of the distance between the slot and a directly adjacent slot along an arc of the coil windings.

In another embodiment, a downhole logging tool includes a tool body having a longitudinal axis, a co-located set of antennas located on the tool body and including at least first and second antennas formed from respective first and second pairs of coil windings having a closed-loop pattern, wherein both the first pair of coil windings and the second pair of coil windings are arranged on diametrically opposed antenna sections. The tool further includes a substantially cylindrical shield disposed over the co-located set of antennas and having an arrangement of slots including: (1) a first set of vertical slots arranged such that they are interposed between each of the underlying antenna sections; (2) a second set of vertical slots arranged such that they are over each of the underlying antenna sections, with each of the second set of vertical slots being substantially perpendicular to a proximate portion of the coil winding in the underlying antenna section; and (3) a set of non-vertical slots arranged over each the underlying antenna sections, wherein each of non-vertical slots is substantially perpendicular to a proximate portion of the coil winding in the underlying antenna section.

Other aspects and advantages of the techniques and embodiments set forth in the present disclosure will become apparent from the following description and the attached claims.

It is to be understood that the drawings are to be used for the purpose of illustration only, and not as a definition of the metes and bounds of the disclosure, the scope of which is to be determined only by the scope of the appended claims.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Further, it should be appreciated that in the development of an actual implementation, as with any engineering or design project, numerous implementation-specific decisions must be made to achieve specific goals, such as system-related and/or business-related constraints, which may vary from one implementation to the other. While such an effort might be complex and time consuming, it would nonetheless be a routine undertaking of design, fabrication, and/or manufacture for those of ordinary skill in the art having the benefit of this disclosure.

Figure 1:
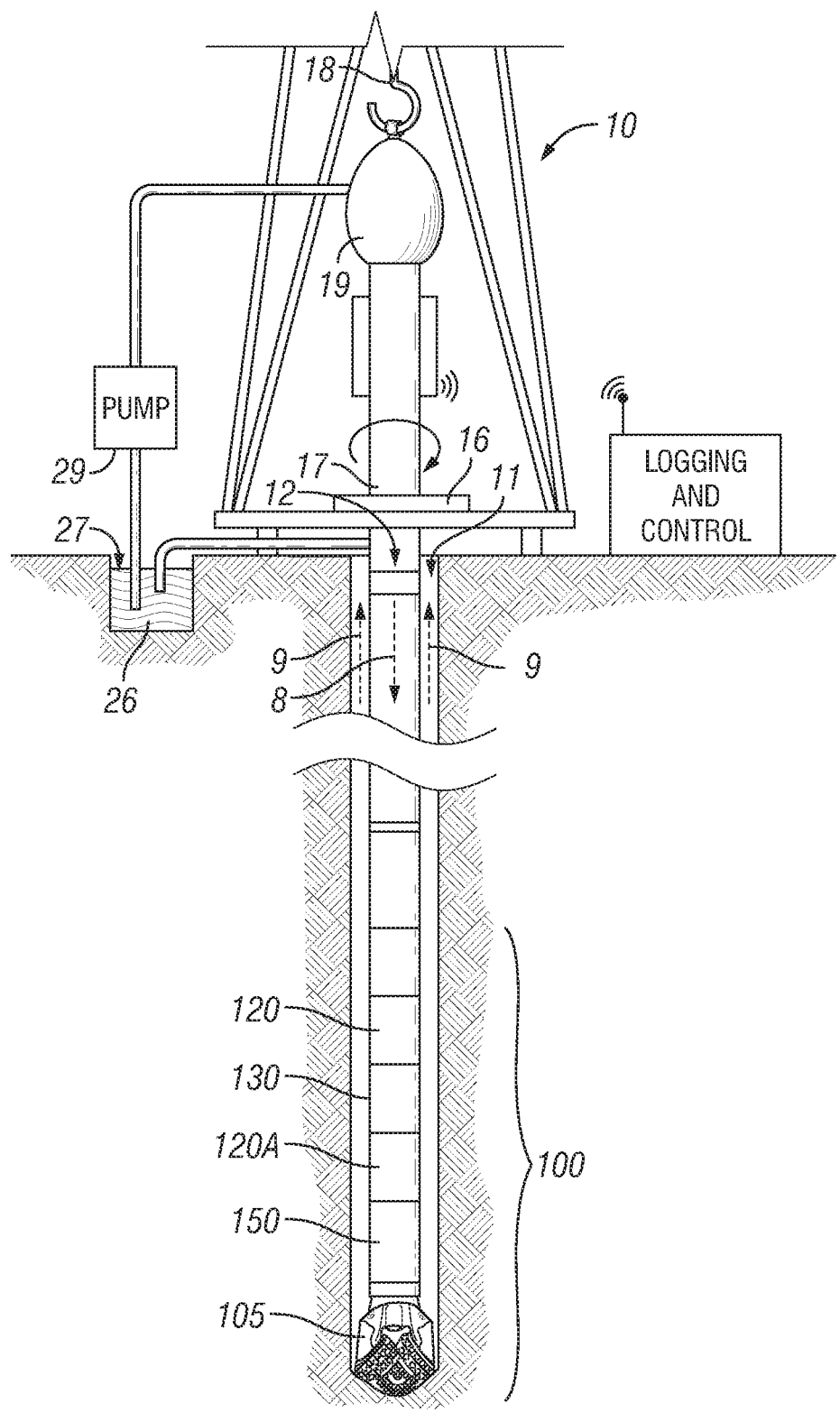
FIG. 1 illustrates a well site system in which aspects set forth in the present disclosure can be employed.

FIG. 1 illustrates a well site system in which the present invention can be employed. The well site can be onshore or offshore. In this exemplary system, a borehole 11 is formed in subsurface formations by rotary drilling in a manner that is well known. Embodiments of the invention can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, kelly 17, hook 18 and rotary swivel 19. The drill string 12 is rotated by the rotary table 16, energized by means not shown, which engages the kelly 17 at the upper end of the drill string. The drill string 12 is suspended from a hook 18, attached to a traveling block (also not shown), through the kelly 17 and a rotary swivel 19 which permits rotation of the drill string relative to the hook. As known in the art, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole, as indicated by the directional arrows 9. In this well known manner, the drilling fluid lubricates the drill bit 105 and carries formation cuttings up to the surface as it is returned to the pit 27 for recirculation.

The bottom hole assembly 100 of the illustrated embodiment includes a logging-while-drilling (LWD) module 120, a measuring-while-drilling (MWD) module 130, a roto-steerable system and motor 150, and drill bit 105.

The LWD module 120 is housed in a special type of drill collar, as is known in the art, and can contain one or multiple types of logging tools. It will also be understood that more than one LWD and/or MWD module, e.g. as represented at 120A, may be employed as part of the bottom hole assembly 100. Thus, it should be understood that references throughout this disclosure to a module at the position of 120 can alternatively mean a module at the position of 120A as well. The LWD module includes capabilities for measuring, processing, and storing information, as well as for communicating with the surface equipment. In the present embodiment, the LWD module may include a resistivity measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. In one embodiment, such an apparatus may include a mud turbine generator powered by the flow of the drilling fluid. In other embodiments, other types of power and/or battery systems may be employed. In the present embodiment, the MWD module may include one or more of the following types of measuring devices: a weight-on-bit measuring device, a torque measuring device, a vibration measuring device, a shock measuring device, a stick slip measuring device, a direction measuring device, and an inclination measuring device.

Figure 2:
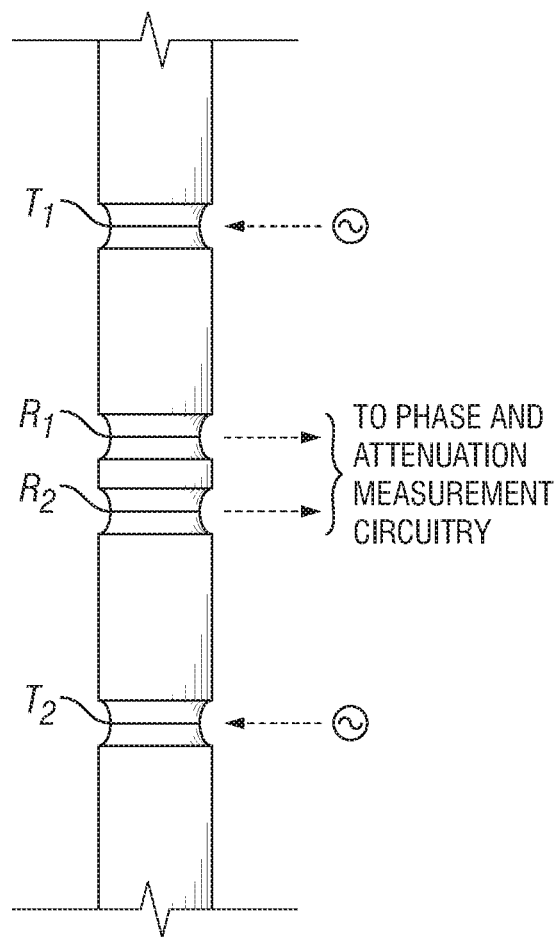
FIG. 2 shows a prior art electromagnetic logging tool.

An example of a tool which can be the LWD tool 120, or can be a part of an LWD tool suite 120A of the system and method hereof, is the dual resistivity LWD tool disclosed in U.S. Pat. No. 4,899,112 to Clark et al. and entitled "Well Logging Apparatus And Method For Determining Formation Resistivity At A Shallow And A Deep Depth," which is hereby incorporated herein by reference. As seen in FIG. 2, upper and lower transmitting antennas, $T_1$ and $T_2$, have upper and lower receiving antennas, $R_1$ and $R_2$, therebetween. The antennas are formed in recesses in a modified drill collar and mounted in insulating material. The phase shift of electromagnetic energy as between the receivers provides an indication of formation resistivity at a relatively shallow depth of investigation, and the attenuation of electromagnetic energy as between the receivers provides an indication of formation resistivity at a relatively deep depth of investigation. The above-referenced U.S. Pat. No. 4,899,112 can be referred to for further details. In operation, attenuation-representative signals and phase-representative signals are coupled to a processor, an output of which is couple-able to a telemetry circuit.

Figure 3A:
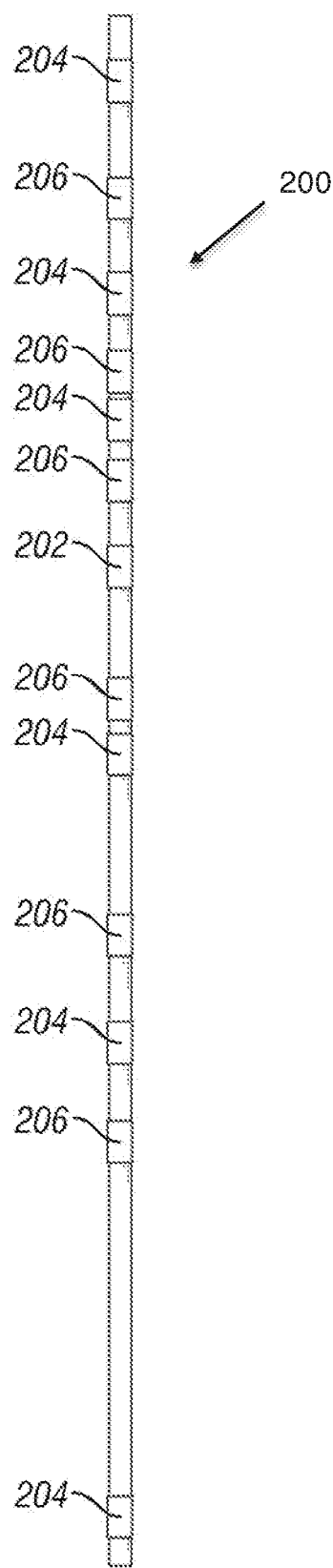
FIG. 3A is a schematic drawing of an electromagnetic induction logging tool, constructed in accordance with the present disclosure.
Figure 3B:
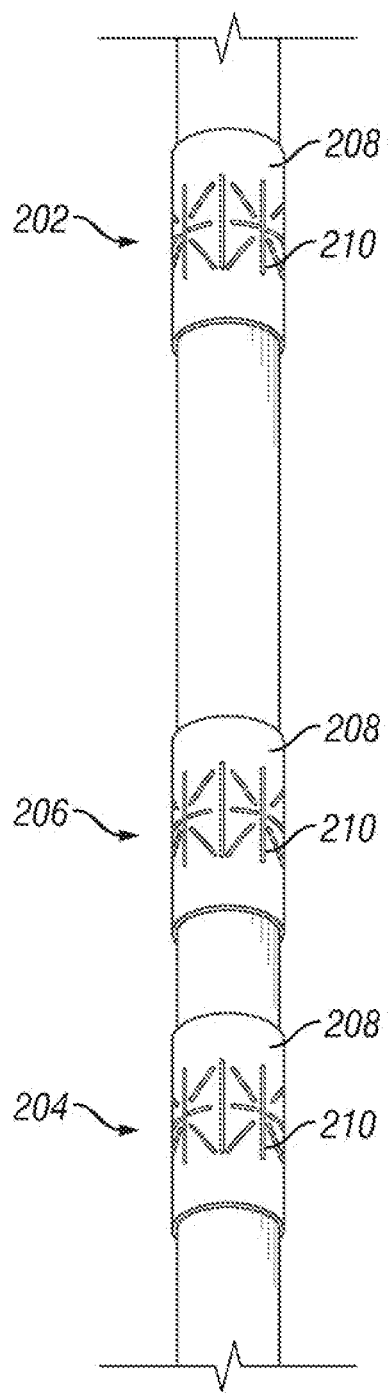
FIG. 3B is an enlargement of a portion of the logging tool of FIG. 3A.

FIG. 3A shows schematically a triaxial resistivity tool having shielded antennas. The embodiment of FIG. 3A is that of an induction resistivity tool 200 on an LWD drill collar. In the embodiment shown, there is a transmitter antenna 202, multiple receiver antennas 204 variously spaced from transmitter antenna 202, and multiple bucking coil antennas 206, also variously spaced from transmitter antenna 202. FIG. 3B is an enlargement of a portion of induction tool 200 showing transmitter antenna 202, one receiver antenna 204 and one bucking coil antenna 206. Bucking coil antenna 206 is located between transmitter antenna 202 and receiver antenna 204, as is conventional and well known in the art.

FIG. 3B also shows shields 208. Shields 208 are preferably made from high strength, erosion resistant, non-magnetic material. For example, non-magnetic metals are a preferred embodiment, but the invention is not limited to metal shields. If a non-magnetic (but conductive) metal shield is used, slots 210 may be cut into shield 208. Slots 210 allow a portion of the electromagnetic wave (e.g., emanating from transmitter antenna 202 or passing from the formation to receiver antenna 204) to pass through shield 208. Slots 210 may be filled with a non-conductive, electromagnetically transparent material such as epoxy, fiberglass, or plastic so as to allow passage of the electromagnetic wave while inhibiting fluid communication therethrough. In the embodiment shown, slots 210 are arranged to be perpendicular to the coil windings of the antenna located beneath shield 208. Shields 208 cover and protect those underlying antenna coil windings.

Figure 4:
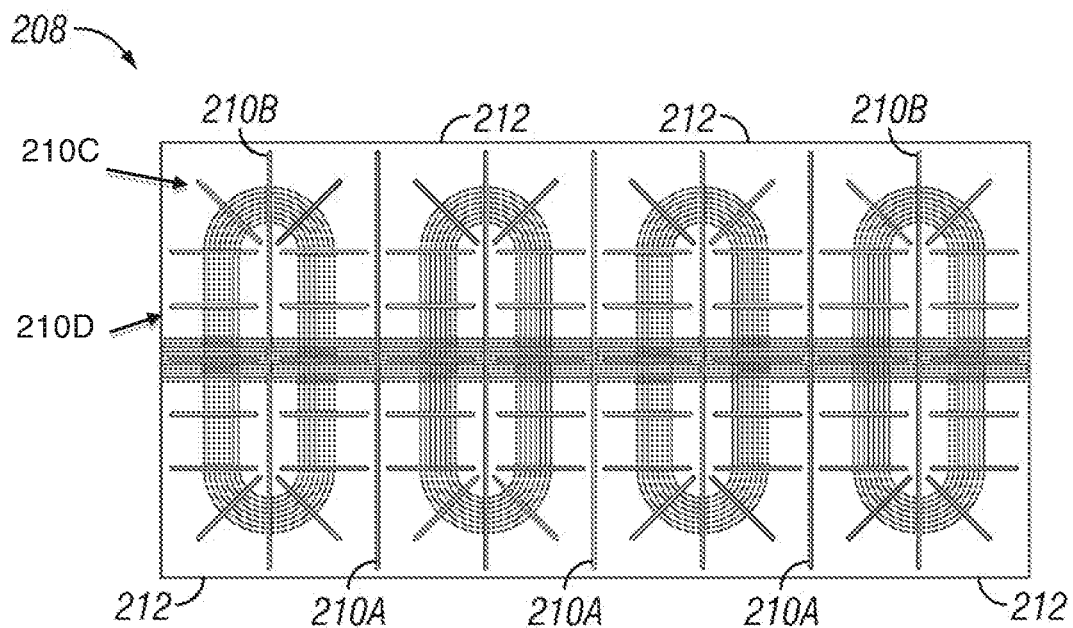
FIG. 4 is a schematic drawing of a shield and underlying antenna coils in accordance with the present disclosure, the shield and antenna coils being drawn opened up and laid out flat for ease of illustration and description.

This is better illustrated in FIG. 4. FIG. 4 shows a shield 208, which is normally cylindrical, opened up and laid flat. In the illustrated embodiment, the shield 208 includes four sections 212, though more or fewer sections may be used in other embodiments. FIG. 4 shows three long vertical slots 210a between each section 212. A fourth vertical slot 210a would be formed if the ends of the laid out section were joined to again form a cylinder. In addition to those four vertical slots 210a, there are vertical slots 210b substantially centered in each section 212. All eight of those vertical slots 210a, 210b allow at least a portion of the electromagnetic wave to or from the axial (Z) coil to pass. In addition, slots 210b also allow portions of the electromagnetic wave to or from the transverse (X, Y) antenna coils to pass, as will be explained further below.

FIG. 4 also shows slots 210c and 210d. Slots 210c are sloped at a substantially forty-five degree angle relative to the vertical slots 210b, and slots 210d are substantially horizontal. FIG. 4 shows ten horizontal slots 210d and four forty-five degree sloped slots 210c in each section 212. However, those are design choices and more or fewer slots may be used and different angles may be chosen, if desired. The coil windings in this embodiment for the transverse (X, Y) antennas are substantially arranged in an oval pattern, similar to an oval track. Horizontal slots 210d are substantially perpendicular to the "straightaway" portions of the oval, and sloped slots 210c are perpendicular to the curved portions.

Figure 5:
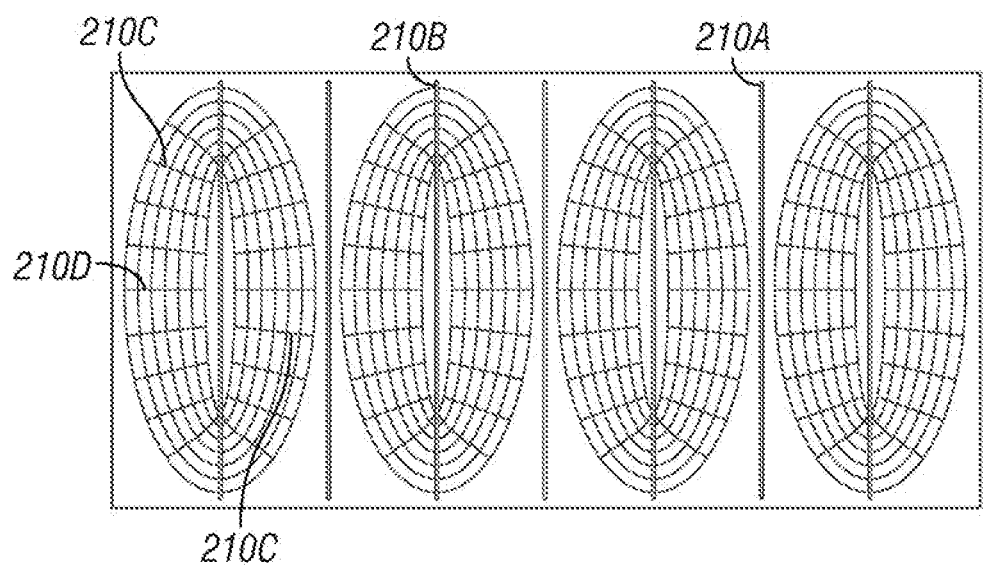
FIG. 5 is a schematic drawing of an alternative embodiment of a shield and underlying antenna coils in accordance with the present disclosure, the shield and antenna coils being drawn opened up and laid out flat for ease of illustration and description.

FIG. 5 shows an alternative embodiment in which the transverse coils are substantially arranged elliptically. Here horizontal slots 210d are aligned with the minor axis of the ellipse, whereas slots 210c are sloped at various angles, each being locally perpendicular to the most proximate portion of the underlying coil windings. Vertical slots 210a, 210b are as described above for the embodiment of FIG. 4.

Figure 6A:
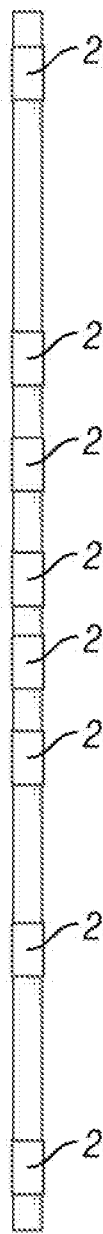
FIG. 6A shows schematically an alternative embodiment of a triaxial resistivity tool having shielded antennas in accordance with the present disclosure.

Similarly, FIG. 6A shows schematically an alternative embodiment of a triaxial resistivity tool having shielded antennas. The embodiment of FIG. 6A is that of a propagation resistivity tool 214 on an LWD drill collar. In the embodiment shown, various transmitter antennas 202 are spaced longitudinally along the tool body, and two receiver antennas 204 are spaced relatively close to one another and between transmitter antennas 202. Many different antenna configurations are possible and within the scope of the present invention. No bucking coil antennas 206 are used in the propagation-type embodiment, as is conventional and well known in the art.

Figure 6B:
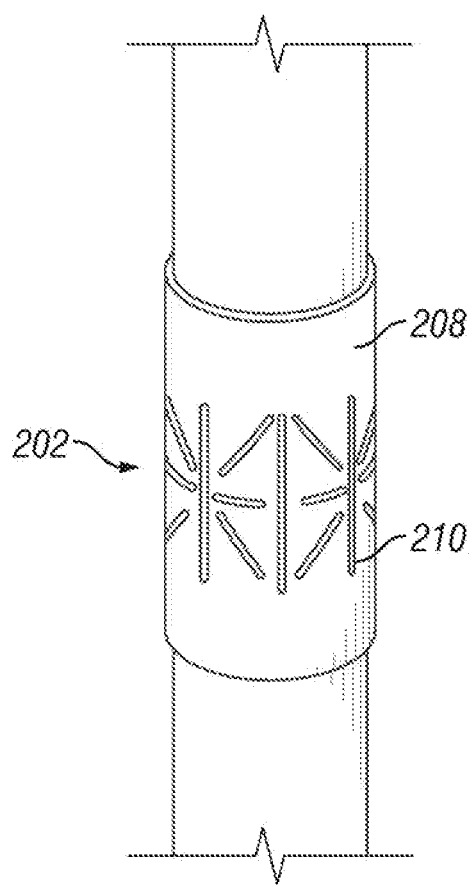
FIG. 6B is an enlargement of a portion of the logging tool of FIG. 6A.

FIG. 6B is an enlargement of a portion of propagation tool 214 showing a shield 208 covering a transmitter antenna 202. Such shields 208 preferably cover and protect all the antennas 202, 204. As described above, shields 208 are preferably made from high strength, erosion resistant, non-magnetic material. Slots 210 may be cut into shield 208 to allow a portion of the electromagnetic wave to pass through shield 208, and may be filled with an electromagnetically transparent material to allow passage of the electromagnetic wave while inhibiting fluid from passing therethrough. As before, slots 210 are preferably arranged to be perpendicular to the coil windings of the antenna located beneath shield 208.

The number of slots 210 is a design choice, but preferably there are sufficient slots 210 to make shield 208 sufficiently transparent to electromagnetic radiation to conduct operations. One possible criterion for designing the number of slots is to make the path length around a slot more than twice the path length between two adjacent slots along the arc of a winding. In accordance with Ohm's law, the resistive closed path circumferentially along the shield's inner surface, radially outward along the shield's thickness, circumferentially along the shield's outer surface, and radially inward along the shield's thickness is less resistive than the resistive path around the slot and circumference of the shield. Current will tend to flow along the least resistive path.

The antennas 202, 204, 206 preferably have dipole moments that are substantially aligned axially, transversely, or tilted relative to the longitudinal axis of the tool. Since downhole tools generally are cylindrical, the antenna coils used on such tools typically conform to a cylindrical shape. For example, the coils may be solenoids, saddle coils, ovals, or elliptical, though other closed-loop shapes are also possible. The coils could be single coils or combined to make, for example, a co-located triaxial set of coils. One possible configuration is that of FIG. 4 in which there is one axial coil (Z-coil), two oval saddle coils that work cooperatively to form one transverse antenna (X-coil), and two oval saddle coils that work cooperatively to form another transverse antenna (Y-coil). The coils may be embedded in a non-conductive material (e.g. plastic) and placed in a recess of a drill collar, fixed in a non-conductive cylinder that can slide onto a drill collar, or pre-formed in two cylindrical halves that join onto the drill collar. Alternatively, the antenna coils may be printed on a flexible printed circuit board or an otherwise flexible circuit may be set in a non-conductive material (e.g., thermal set fiberglass) and placed on the tool body (e.g., mandrel or drill collar).

In addition, terrific material may be placed in recesses in a drill collar, for example, or otherwise incorporated into the antenna structure. That is, recessed slots could be cut into the drill collar and filled with ferritic material. The antenna coil is formed with the windings crossing over the ferrite-filled slots. The recessed slots are preferably arranged to be locally perpendicular to the antenna windings and uniformly spaced along the path of the coil windings. The antennas may be electrically connected via insulated and hydrostatically sealed wires or connectors to associated electronics via feedthroughs, as is well known in the art. While the embodiments described above are described in terms of a while-drilling tool, the invention is not limited to while-drilling and may be used, for example, in wireline tools as well.

The antennas may be designed to operate at various frequencies. For example, propagation tools may use lower frequencies, while induction tools may use multiple frequencies. Different frequencies may be used to obtain multiple depths of investigation.

The logging tools described herein may be used to investigate formation properties and other downhole parameters. The wireline or while-drilling logging tool, if an induction tool, can be configured to make balanced induction measurements, or, if a propagation tool, may make propagation measurements through the shields. For example, one could infer from the measurements resistive anisotropy of the formation (i.e., vertical and horizontal resistivity), relative dip, azimuth, distances to bed boundaries, radius of the invasion zone, and anisotropy of the invasion zone. This information may be obtained and used in real-time or recorded for later processing. Measurements and their associated inferences may be made even when the drill string is not rotating. In addition, though the embodiments described above have focused on electromagnetic logging tools, the invention also includes other logging tools that use electromagnetic signals to make their measurements. For example, the shields described herein may be used on NMR logging tools to excite directional B1 fields.

While the invention has been described with respect to a limited number of embodiments, those skilled in the art, having benefit of this disclosure, will appreciate that other embodiments can be envisioned that do not depart from the scope of the invention as disclosed herein. Accordingly, the scope of the invention shall be limited only by the attached claims.

What is claimed is:
1. A logging tool for acquiring data in an earth formation comprising:
a tool body having a longitudinal axis;

a co-located set of antennas located on the tool body and comprising at least first and second antennas formed from respective first and second pairs of coil windings having a closed-loop pattern, wherein both the first pair of coil windings and the second pair of coil windings are arranged on diametrically opposed antenna sections; and a substantially cylindrical shield disposed over the co-located set of antennas and having a plurality of slots formed therethrough, wherein the plurality of slots comprises:

- a first set of vertical slots arranged such that they are interposed between each of the underlying antenna sections;
- a second set of vertical slots arranged such that they are over each of the underlying antenna sections, each of the second set of vertical slots being substantially perpendicular to a proximate portion of the coil winding in the underlying antenna section, wherein each of the second set of vertical slots is arranged such that it substantially bisects the underlying closed loop pattern of the coil winding in the corresponding antenna section; and
- a set of non-vertical slots arranged over each of the underlying antenna sections, wherein each of non-vertical slots is substantially perpendicular to a proximate portion of the coil winding in the underlying antenna section.

2. The logging tool of claim 1, wherein the first and second set of vertical slots are arranged in an alternating manner around the circumference of the shield.

3. The logging tool of claim 1, wherein the tool body comprises a recess and the coil windings corresponding to the first and second antennas are embedded in a non-conductive material and disposed in the recess.

4. The logging tool of claim 1, wherein the coil windings are formed on two cylindrical halves that are joined together around the tool body, and wherein the shield is disposed over the two cylindrical halves containing the coil windings.

5. The logging tool of claim 1, wherein the non-vertical slots comprise horizontal slots and sloped slots.

6. The logging tool of claim 5, wherein the closed-loop pattern comprises an oval pattern having straightaway portions and curved portions, wherein the horizontal slots in each antenna section are substantially perpendicular to a straightaway portion of the oval pattern and the sloped slots in each antenna section are substantially perpendicular to a curved portion of the oval pattern.

* * * * *